United States Patent [19]
Dieulesaint et al.

[11] 4,209,725
[45] Jun. 24, 1980

[54] SELENIUM LAYER PIEZOELECTRIC DEVICE

[75] Inventors: Eugène Dieulesaint; Daniel Royer; Richard Guedj, all of Paris, France

[73] Assignee: Thomson-CSF, Paris, France

[21] Appl. No.: 954,079

[22] Filed: Oct. 24, 1978

[30] Foreign Application Priority Data

Oct. 25, 1977 [FR] France ............................ 77 32053

[51] Int. Cl.² .......................................... H01L 41/10
[52] U.S. Cl. ...................................... 310/313; 310/311; 310/334; 310/360; 333/150; 333/193; 252/62.9
[58] Field of Search ............... 310/313, 334, 360, 311; 333/147, 149, 150, 154, 164, 152, 153, 189–191, 195, 193; 357/26; 307/317; 252/62.9; 350/161 SW

[56] References Cited

U.S. PATENT DOCUMENTS

| | | | |
|---|---|---|---|
| 3,516,027 | 6/1970 | Wasilik | 333/152 |
| 3,547,596 | 12/1970 | Kolb | 252/62.9 |
| 3,706,055 | 12/1972 | Dieulesaint et al. | 333/152 |
| 3,836,876 | 9/1974 | Marshall et al. | 333/195 X |
| 3,893,047 | 7/1975 | Lardat | 333/153 |
| 3,903,486 | 9/1975 | Bert | 333/152 |

*Primary Examiner*—Mark O. Budd
*Attorney, Agent, or Firm*—Cushman, Darby & Cushman

[57] ABSTRACT

The invention relates to piezoelectric devices employing a piezoelectric layer deposited on a substrate devoid of piezoelectric properties at ambient temperature. The device in accordance with the invention is provided with a piezoelectric layer made from a mono-atomic crystalline material, namely selenium. The invention is applicable to the excitation of surface elastic waves along non-piezoelectric substrates, to the excitation of bulk elastic waves and to the detection of infrared radiations.

13 Claims, 6 Drawing Figures

SELENIUM LAYER PIEZOELECTRIC DEVICE

The present invention relates to devices comprising piezoelectric material provided with electrodes. These devices are currently employed as electromechanical transducers for effecting energy exchanges in the form of bulk or surface elastic waves. However, they may also be employed as infrared radiation detectors, since piezoelectric substances may be pyroelectric. In applications concerning the conversion of electric energy into vibratory energy and vice versa, many electromechanical devices are known, such as resonators, filters and delay lines. The latter employ piezoelectric materials the most frequently used being quartz and lithium niobate. Elastic waves are easily excited when the media which must propagate these waves are formed by plates cut from the aforementioned piezoelectric materials. However, when it is desired, for example, to exchange surface elastic waves in a relatively extended region, it is often advantageous to employ a substrate made from a material which has no piezoelectric properties. Consequently, it is necessary to provide on the surface of the substrate one or more thin layers of piezoelectric material which requires deposition on the substrate for example by vacuum evaporation.

When piezoelectric or pyroelectric devices are produced in batches, there is also the problem of the deposition on the substrate of relatively extended layers which have a good crystalline quality.

Among the non-piezoelectric materials which are well adapted for the construction of substrates for propagating elastic waves and in particular Rayleigh waves, there may be mentioned silicon and silica. As concerns the piezoelectric layers, there have already been employed with success zinc oxide, cadmium sulphide and aluminium nitride. The use of these chemical compounds is, however limited as concerns the extent of the layers and the regularity that the latter must have with respect to the crystallographic orientation. The difficulty encountered upon the deposition of these compounds is above all of a stoichiometric type.

In order to overcome this drawback, the invention teaches the use of a monoatomic piezoelectric material as the deposited material. The material which is the most suitable for achieving this purpose is selenium since, owing to its forbidden band width equal to 1.6 electron-volts, this non-metallic element has at ambient temperature a suficiently high resistivity to envisage the use of its piezoelectric properties. Experiments reveal that selenium permits the excitation and the propagation of surface elastic waves under good conditions.

In accordance with the present invention, there is provided a piezoelectric device comprising a substrate non-piezoelectric at ambient temperature, a deposit of piezoelectric material carried by said substrate, and electrode means located on at least one of the major faces of said deposit; said deposit comprising a layer of selenium in the crystalline state.

For a better understanding of the present invention, and to show how the same may be carried into effect, reference will be made to the ensuing description and the accompanying drawings among which:

Figure 1:
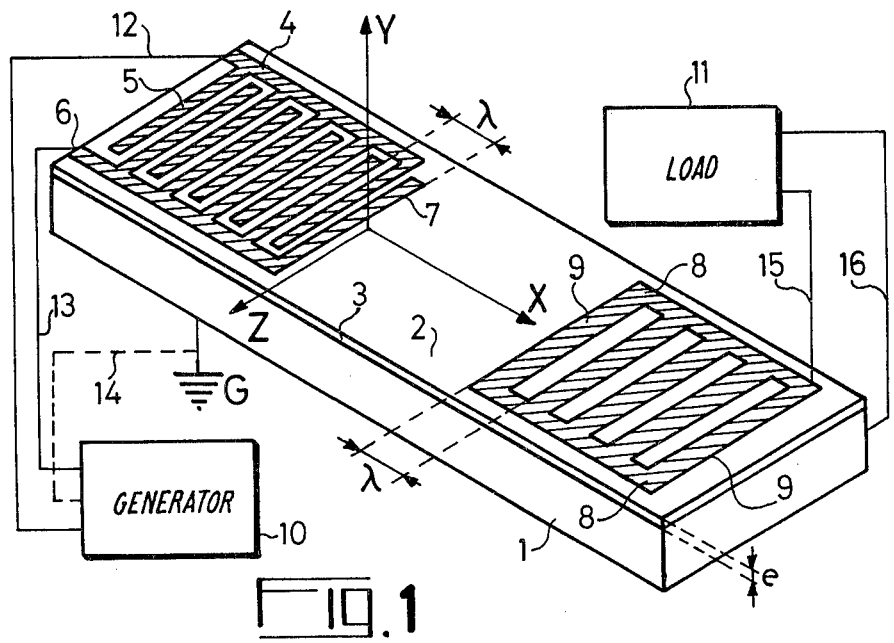
FIG. 1 is a partial isometric view of a piezoelectric device according to the invention.

FIG. 1 represents by way of a non-limitative example a delay line employing surface elastic waves and comprising a layer of selenium 3 having a thickness e deposited on a monocrystalline substrate of tellurium 1. For the sake of convenience, the casing in which this device is mounted has not been shown in FIG. 1. This casing serves to shield the layer of selenium 3 from the action of the surrounding light since selenium is a photoconductive substance and it is necessary to ensure that its resistivity does not diminish unless if this effect is employed for light control. In the following description it will be assumed that the device operates in the dark.

Tellurium is advantageously employed for making the substrate 1, since this non-metallic element is located just after selenium in group VI-b of the periodic table of elements. It belongs to the same space group as selenium with a lattice having closely similar parameters. As the width of the forbidden band is 0.33 electron-volt, it may be considered as a conductor at ambient temperature and its piezoelectric properties cannot be used. Of course, the substrate 1 may be made from materials devoid of piezoelectric properties and having a high resistivity, such as silicon, silica, ceramic, without mentioning the organic materials which attenuate but slightly the surface elastic waves. The vacuum evaporation of selenium on the tellurium is carried out at a temperature of 260° C. During the evaporation operation, the substrate is maintained at a temperature of 140° C. Apart from the direct evaporation, a method of welding by thermocompression or adhesion may also be employed. It comprises depositing selenium on a crystalline tellurium substrate, then causing the deposit to adhere by its free face on some further substrate, and selectively dissolving the tellurium substrate. It is well to deposit gold on the selenium in order to protect it from oxidation. If this gold deposit must subsequently serve to produce the electrodes, it may be given a thickness of around 4,000 Å. Thus it is clear that the characteristics of the substrate are far from being critical.

In FIG. 1, the whole of the upper side of the substrate 1 is covered with the selenium layer 3. The upper side 2 of the deposit 3 is provided with two interdigitated transducer combs whose teeth 5 and 7 define with the edges 4 and 6 a first system of gold electrodes. This system cooperates with the deposit 3 in order to radiate surface elastic waves in the direction X when it is excited by the signal generator 10 through the connection wires 12 and 13. The substrate 1 is connected to earth G in order to reduce the electrostatic coupling relative to the grating 8 of conductive bands 9 which occupy the other end of the side 2. The conductive grating 8 receives the surface elastic waves and converts them into an alternating electric voltage. This voltage appears between the grating 8 and the substrate 1 which performs the function of a backing-electrode; it is transmitted to the electrical receiver 11 through connecting wires 15 and 16. The system of axes XYZ relates to the crystal structure of the substrate 1. It concerns a Y cut. The teeth 5 and 7 and the bars 9 are oriented to be parallel to the Z axis. The wavelength λ of the surface elastic waves is equal to the pitch of the bars 9 and to the pitch of the teeth pertaining to the same transducer comb 4 or 6. The two electrode configurations illustrated in FIG. 1 make it clear that the surface elastic waves may be excited in two different ways. The piezoelectric tensor has a component $d_{14}$ which governs the transducing effect. The electric field produced vertically above the conductive bands 9 induces equiphase voltage components between the grating 8 and the backing-electrode formed by the substrate 1. The transfer function of the transducer 8, 9 comprises a single transmitted frequency band 19 shown in dotted line in FIG. 3. The attenuation A in decibels has been expressed as a function of the frequency f of the surface elastic wave.

Figure 3:
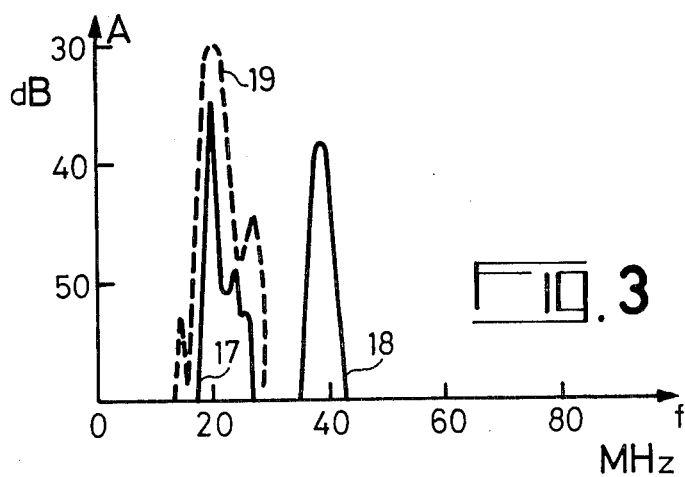
FIG. 3 is an explanatory diagram.

As concerns the interdigitated comb transducer 4, 5, 6, 7, there are two transmission frequency bands 17 and 18 shown in full line in FIG. 3. The transmission frequency band 17 is that which is normally observed when an interdigitated comb transducer is associated with a non-conductive piezoelectric substrate. The other transmission frequency band 18 seems to be attributed to the fact that the substrate 1 is conductive since, in this case, if the excitation of the teeth 5 and 7 is floating, there is a possibility of an equiphase excitation under each of the teeth. As the teeth 5 and 7 form a grating which is twice as close as the grating 8, there is observed the second transmission frequency band 18 centered on the double of the central frequency of the first frequency band 17. If a balanced output generator 10 is adapted and if the neutral connection 14 is connected to earth G, the level of the transmission frequency band 18 may be reduced.

Of course, the line of FIG. 1 may be provided with two interdigitated comb transducers or two equiphase gratings such as 8.

By way of a non-limitative example, the characteristics of a line formed by two interdigitated comb transducers will now be given.

A layer of selenium having a thickness e equal to 6.0 $\mu$m was deposited on an Y cut substrate of tellurium. The length of the layer 3 measured along X is equal to 35 mm and its width is equal to 10 mm. Each transducer comb comprises thirty equidistant teeth extending over an area of 12.5 mm; the transducers are spaced from each other 6 mm.

The length of the teeth of the combs measured along Z is equal to 4 mm. A test signal formed by a pulse of 1.2 $\mu$S with a carrier frequency of 19.2 MHz has permitted the measurement of a delay of 7 $\mu$S to which corresponds a Rayleigh wave velocity of 960 m/s. This velocity is closer to that observed with tellurium than that which characterizes the propagation on a substrate of selenium. This is explained by the fact that the thickness e=6 $\mu$m of the selenium layer is much less than the wavelength of the Rayleigh waves, which reaches 50 $\mu$m. The diagram of FIG. 3 completes the foregoing practical indications.

Figure 2:
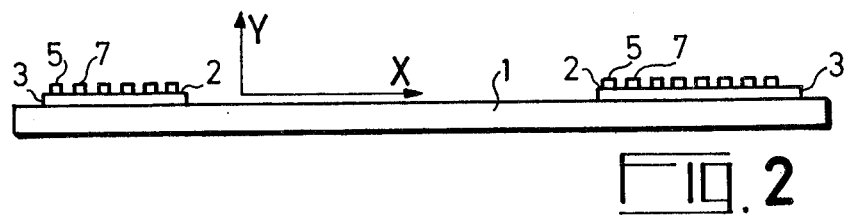
FIG. 2 is a partial elevational view of a modification of the device of FIG. 1.

Thus it is clear that it is easy to emit and receive surface elastic waves exchanged along a non-piezoelectric substrate by the use of a selenium deposit whose thickness is distinctly less than the wavelength $\lambda$. In particular, it can be seen that the selenium layer 3 does not have to exist in regions other than vertically above the electrodes. This configuration is clearly illustrated in FIG. 2 where the same references designate the corresponding elements of FIG. 1.

Of course, the invention is not limited to the use of transducer combs having a constant pitch and rectilinear teeth of equal length. A device comprising a single electromechanical transducer whose combs have a non-uniform pitch and rectilinear or curved teeth of unequal length, is within the scope of the invention. Likewise, a single strip 9 cooperating with the substrate 1 is sufficient to produce a transducer element capable of exciting and receiving surface waves.

In the foregoing, the selenium was used in the dark.

Figure 4:
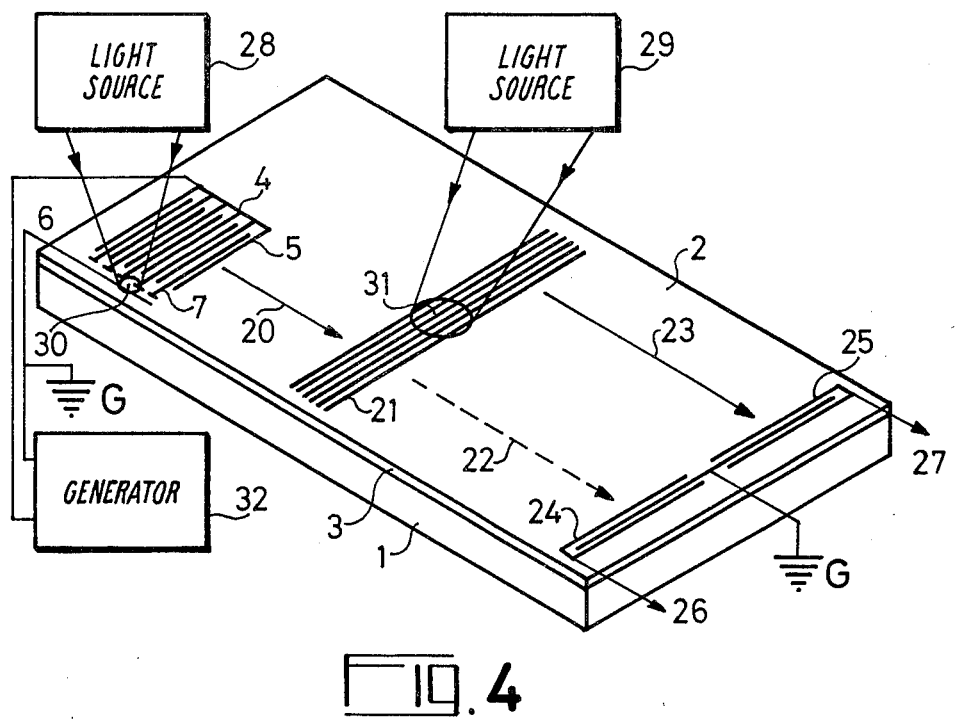
FIG. 4 is a partial isometric view of another embodiment of the device according to the invention.
Figure 5A:
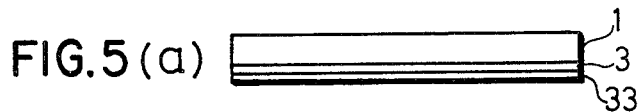
FIG. 5 illustrates a method for producing batches of piezoelectric devices according to the invention.
Figure 5B:
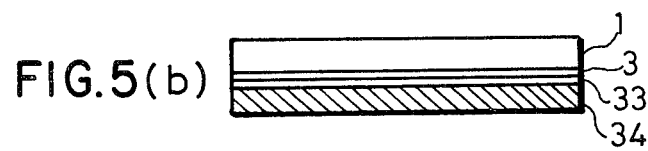
Figure 5C:
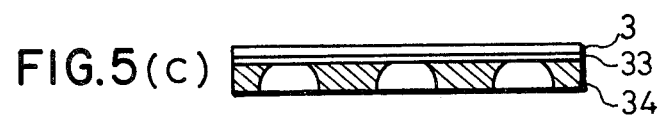
Figure 5D:
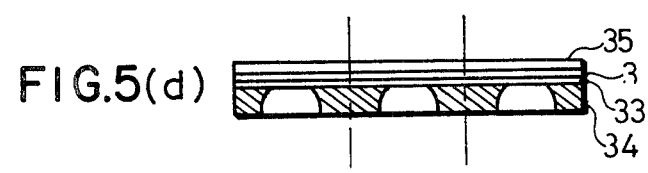
Figure 5E:
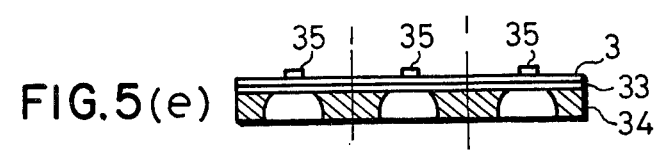

FIG. 4 shows a device in which the photoconductive property of selenium is also used. This device comprises an emitter transducer connected to an electric generator 32 and formed by an interdigitated transducer comb 4, 5 with a grating of teeth 7 which are not electrically connected to the edge 6. A source of light 28 projects a spot on the layer 3. By means of the photoconductivity of the selenium, this spot permits establishing a selective electric connection between one or more of the teeth 7 and the conductive edge 6. The surface wave 20 emitted can therefore change its origin owing to this optical switching and the emission may even be interrupted if the source 28 is extinguished. The emitted wave 20 travels toward a grating of conductive strips 21 which form a coupler with the piezoelectric layer 3. Consequently, the energy of the wave 20 does not continue its route on the path 22 until it reaches the receiver transducer 24. The energy received by the coupler 21 is re-emitted along the path 23 in the direction of the receiver transducer 25. An output signal is consequently available on the channel 27. With a source of light 29 projecting a spot 31 on the coupler 21, it is possible to establish a short-circuit by the photoconductivity of the selenium. The coupler 21 ceases to perform its function and the output signal switches from the channel 27 to the channel 26.

The example just described clearly shows what the utilizations of the device according to the invention may be when the photoconductivity of the selenium layer is used. Further, the utilization of a silicon plate as the substrate permits the production of complex devices which group transducers and their control circuits in an integrated form.

It was mentioned above that the selenium deposit may solve the problem presented by the batch production of piezoelectric devices. This application is illustrated in FIGS. 5 and 6 which concern a bulk elastic wave filter comprising, for example, two coupled resonators.

A bulk wave electromechanical resonator is essentially a plate or strip of piezoelectric material provided on its two major faces with electrodes forming a capacitor. The vibration of the plate in accordance with a thickness mode and at its natural frequency defines a very acute resonance. The unit filtering device of FIG. 6 comprises a hollowed-out substrate 34 carrying on its upper side a very thin strip 3 of selenium. Interposed between the substrate 34 and the strip 3 is an electrode 33 formed by a thin gold deposit which cooperates with two electrodes 35 which are vertically above the hollow of the substrate. In this way, two mechanically coupled resonators are obtained, the unit forms a bandpass filter having two pairs of terminals.

Figure 6:
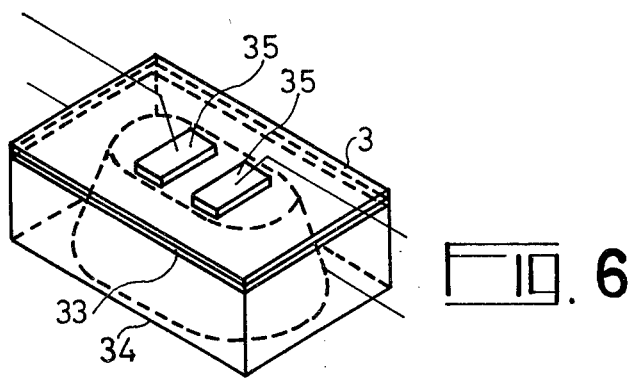
FIG. 6 is an isometric view of a device obtained by the method illustrated in FIG. 5.

FIG. 6 illustrates several steps in the batch production of the unit device shown in FIG. 6. Shown at (a) in FIG. 5 is the first step which comprises the deposition, for example on a tellurium substrate 1, of a thin crystalline selenium layer 3. This deposit is effected by vacuum evaporation and is followed by a deposition of gold in a very thin layer 33. A relatively thick layer 34 for forming the final substrate may be grown on the gold deposit. This deposit is seen at (b) in FIG. 5 and is obtained for example by plating and a supply of metal. At (c), in FIG. 5, there are shown the separating limits of three unit devices. The hollows of the substrate 34 have been obtained by a chemical attack reaching the layer 33. The tellurium substrate 1 was removed and this bares the selenium layer 3. At (d), it can be seen that a thin conductive layer 35 was deposited by evaporation on the selenium layer 3. This step is superfluous if there was conserved in the preceding step a thin film of tellurium which acts as the layer 35. By masking and chemical attack, there remain to be defined the electrodes 35 shown at (e) in FIG. 5. The unit devices have now merely to be separated and mounted in casings which shield them from the ambient light.

Lastly, it must be mentioned that the device of FIG. 6 provided with a single electrode 35 having an infrared radiation absorbing coating may constitute an effective low-inertia infrared detector. For this purpose, there is employed a casing provided with a window which is opaque to the radiations which excite the photoconductivity of the selenium. Selenium exhibits a pyroelectric effect and its thermal conductivity is low, which conveniently limits the heat exchanges with the substrate 34.

What we claim is:

1. A piezoelectric device comprising a substrate non-piezoelectric at ambient temperature, a deposit of piezoelectric material carried by said substrate, and electrode means located on at least one of the major faces of said deposit; said deposit comprising a layer of selenium in the crystalline state; said electrode means being disposed on the free side of said selenium deposit opposed to said substrate; said substrate being capable of propagating surface elastic waves, said electrode means cooperating with said deposit so as to form at least one electromechanical transducer radiating said surface elastic waves.

2. A device as claimed in claim 1, wherein said selenium deposit completely covers the supporting face of said substrate.

3. A device as claimed in claim 1, wherein said selenium deposit is interrupted outside zones occupied by said electrode means.

4. A device as claimed in claim 1, wherein said substrate is capable of propagating surface elastic waves, said substrate performing the function of a backing-electrode and cooperating with said electrode means so as to form at least one electromechanical transducer radiating said surface elastic waves.

5. A device as claimed in claim 1, wherein said electromechanical transducer is an interdigitated comb transducer.

6. A device as claimed in claim 4, wherein said electromechanical transducer is a grating of interconnected conductive strips which produce an equiphase radiation.

7. A device as claimed in claim 1, wherein at least one grating of conductive strips is deposited on the free major face of said selenium deposit for receiving said surface elastic waves.

8. A device as claimed in claim 1, further comprising a casing preventing ambient radiations from exciting the photoconductivity of said selenium deposit.

9. A device as claimed in claim 1, wherein said selenium deposit adheres to a substrate which propagates surface elastic waves in an isotropic manner along the supporting face.

10. A device as claimed in claim 8, further comprising photoexciting means ensuring the selective excitation of the photoconductivity of said selenium deposit so as to inhibit the piezoelectric transducing effect by a short-circuiting of said electrode means.

11. A device as claimed in claim 8, further comprising photoexciting means acting locally on said selenium deposit so as to establish through said deposit connections between said electrode means and further conductors present on said deposit.

12. A device comprising a substrate non-piezoelectric at ambient temperature, a deposit of piezoelectric material carried by said substrate, and electrode means located on at least one of the major faces of said deposit; said deposit comprising a layer of selenium in the cristalline state said selenium being deposited on an Y cut substrate of tellurium.

13. A device comprising a substrate non-piezoelectric at ambient temperature, a deposit of piezoelectric material carried by said substrate, and electrode means located on at least one of the major faces of said deposit; said deposit comprising a layer of selenium in the cristalline state said selenium being deposited on a substrate of silicon.

* * * * *